United States Patent
Aida et al.

(10) Patent No.: US 8,373,062 B2
(45) Date of Patent: Feb. 12, 2013

(54) SOLAR CELL, AND METHOD FOR PRODUCING THE SOLAR CELL

(75) Inventors: Yasuhiro Aida, Chuo-ku (JP); Masato Susukida, Chuo-ku (JP)

(73) Assignee: TDK Corporation, Tokyo (JP)

( * ) Notice: Subject to any disclaimer, the term of this patent is extended or adjusted under 35 U.S.C. 154(b) by 333 days.

(21) Appl. No.: 12/718,528

(22) Filed: Mar. 5, 2010

(65) Prior Publication Data

US 2010/0229951 A1 Sep. 16, 2010

(30) Foreign Application Priority Data

Mar. 13, 2009 (JP) ................. P2009-060889

(51) Int. Cl.
*H01L 31/00* (2006.01)
(52) U.S. Cl. ...................... 136/262; 136/264
(58) Field of Classification Search ............. 136/262, 136/264, 265
See application file for complete search history.

(56) References Cited

U.S. PATENT DOCUMENTS

| | | | |
|---|---|---|---|
| 6,259,016 B1 | 7/2001 | Negami et al. | |
| 2002/0106873 A1* | 8/2002 | Beck et al. | 438/482 |
| 2004/0063320 A1* | 4/2004 | Hollars | 438/689 |
| 2004/0261841 A1* | 12/2004 | Negami et al. | 136/262 |
| 2006/0180200 A1 | 8/2006 | Platzer Bjorkman et al. | |

FOREIGN PATENT DOCUMENTS

| | | |
|---|---|---|
| JP | B2-3249342 | 1/2002 |
| JP | B2-3337494 | 8/2002 |
| JP | B2-3434259 | 8/2003 |
| JP | B2-3468328 | 11/2003 |
| JP | A-2004-47916 | 2/2004 |
| JP | B2-3837114 | 10/2006 |
| JP | A-2006-525671 | 11/2006 |

OTHER PUBLICATIONS

Nishiwaki et al., Solar Energy Materials & Solar Cells, 77 (2003) 359-368.*
Minemoto et al., "Theoretical analysis of the effect of conduction band offset of window/CIS layers on performance of CIS solar cells using device simulation," Solar Energy Materials and Solar Cells, 2001, 67, Elsevier Science B.V., pp. 83-88.
Repins et al., "19.9%-efficient ZnO/CdS/CuInGaSe$^2$ Solar Cell with 81.2% Fill Factor," Progress in Photovoltaics: Research and Applications, 2008, 16, John Wiley & Sons, Ltd., pp. 235-239.

* cited by examiner

*Primary Examiner* — Jennifer Michener
*Assistant Examiner* — Eli Mekhlin
(74) *Attorney, Agent, or Firm* — Oliff & Berridge, PLC

(57) ABSTRACT

A solar cell is provided as one capable of increasing the open voltage when compared with the conventional solar cells. A solar cell according to the present invention has a p-type semiconductor layer containing a group Ib element, a group IIIb element, and a group VIb element, and an n-type semiconductor layer containing a group Ib element, a group IIIb element, a group VIb element, and Zn and formed on the p-type semiconductor layer. A content of the group Ib element in the n-type semiconductor layer is from 15 to 21 at. % to the total number of atoms of the group Ib element, the group IIIb element, the group VIb element, and Zn in the n-type semiconductor layer, and a content of Zn in the n-type semiconductor layer is from 0.005 to 1.0 at. % to the total number of atoms of the group Ib element, the group IIIb element, the group VIb element, and Zn in the n-type semiconductor layer.

7 Claims, 5 Drawing Sheets

(A)

(B)

SOLAR CELL, AND METHOD FOR PRODUCING THE SOLAR CELL

BACKGROUND OF THE INVENTION

1. Field of the Invention

The present invention relates to a solar cell, and a method for producing the solar cell.

2. Related Background Art

Thin-film solar cells using a thin-film semiconductor layer as a photo-absorber are under development in place of the bulk crystal silicon solar cells under spread of use. Among others, the thin-film solar cells using a p-type compound semiconductor layer containing a group Ib element, a group IIIb element, and a group VIb element, as a photo-absorbing layer are expected as next-generation solar cells because they show high energy conversion efficiencies and are unlikely to be deteriorated by light (cf. Japanese Patents No. 3249342, No. 3837114, and No. 3434259, Published Translation of PCT Application No. 2006-525671, Japanese Patents No. 3468328 and No. 3337494, Japanese Patent Application Laid-open No. 2004-047916, and Solar Energy Materials and Solar cells 67 (2001): 83-88). Specifically, the thin-film solar cells using as a photo-absorbing layer, $CuInSe_2$ consisting of Cu, In, and Se (hereinafter "CIS"), or $Cu(In_{1-a},Ga_a)Se_2$ (hereinafter "CIGS") obtained by replacing a part of In being the group IIIb element in CIS with Ga, demonstrate high conversion efficiencies (cf. Prog. Photovolt: Res. Appl. (2008), 16: 235-239).

SUMMARY OF THE INVENTION

In general, a thin-film solar cell having the p-type semiconductor layer consisting of CIGS as a photo-absorbing layer (which will be referred to hereinafter as "CIGS solar cell") has a structure in which a molybdenum back electrode (positive electrode), a p-type photo-absorbing layer (p-type semiconductor layer), an n-type buffer layer (n-type semiconductor layer), a semi-insulating layer, a transparent conductive layer, and an extraction electrode (negative electrode) are laid in order on a soda-lime glass as a substrate. The conversion efficiency η of this CIGS solar cell is expressed by Eq (A) below.

$$\eta = V_{oc} \cdot I_{sc} \cdot F.F./P_{in} \times 100 \quad (A)$$

In Eq (A) above, $V_{oc}$ is the open voltage, $I_{sc}$ the short-circuit current, F.F. the fill factor, and $P_{in}$ the incident power.

As apparent from Eq (A) above, the conversion efficiency is to be improved with increase in each of the open voltage, the short-circuit current, and the fill factor. In general, the pn junction solar cell tends to increase the open voltage with increase in the bandgaps (Eg) of the p-type photo-absorbing layer and the n-type buffer layer. On the other hand, the short-circuit current is determined mainly by the quantum efficiency of the p-type photo-absorbing layer. As Eg of the p-type photo-absorbing layer becomes smaller, the p-type photo-absorbing layer comes to absorb light of longer wavelength and thus the short-circuit current tends to increase. As just described, the open voltage and the short-circuit current are in the trade-off relation. The optimum value of Eg of the p-type photo-absorbing layer for achieving a good balance between them is believed to be from 1.4 to 1.5 eV in view of the correlation with the solar spectrum. Therefore, Eg of the p-type photo-absorbing layer is desired to be controlled in the range of 1.4 to 1.5 eV.

Eg of the p-type photo-absorbing layer can be controlled by modifying the molar ratio of In and Ga being group IIIb elements. For example, in the case of $Cu(In_{1-a},Ga_a)Se_2$, when a is modified from 0 to 1, Eg can be expanded from 1.04 eV to 1.68 eV. For setting Eg of the p-type photo-absorbing layer in the optimum range of 1.4 to 1.5 eV, a can be defined in the range of 0.5 to 0.8.

However, in the p-type photo-absorbing layer achieving the currently highest conversion efficiency, a is 0.2-0.3, i.e., the molar ratio Ga/(In+Ga) is 0.2-0.3, and Eg is 1.2-1.3 eV. Therefore, there is a room for expanding Eg to the optimum level of 1.4 to 1.5 eV, in order to increase the conversion efficiency of the solar cell. However, if Ga/(In+Ga) is increased to expand Eg, the reverse saturation current will increase to lower the open voltage and the conversion efficiency, opposite to the aforementioned tendency. It is reported that one of the reasons for it is an increase in the difference between the energy level of the bottom of the conduction band of the p-type photo-absorbing layer (hereinafter "CBM" (Conduction band minimum)) and the CBM of the n-type buffer layer at the pn junction interface (cf. Solar Energy Materials and Solar cells 67 (2001): 83-88). The value obtained by subtracting the CBM of the p-type photo-absorbing layer from the CBM of the n-type buffer layer at the pn junction interface will be referred to hereinafter as "CBM offset."

In general, the CIGS solar cell has the n-type buffer layer consisting of cadmium sulfide (CdS). In this CIGS solar cell, where Ga/(In+Ga) is not less than 0.5 in order to wide-gap the p-type photo-absorbing layer, the CBM offset $\Delta E_c$ becomes negative as shown in FIG. 2B. Namely, the CBM of the p-type photo-absorbing layer becomes larger than the CBM of the n-type buffer layer. In the case of this band structure, recombination of majority carriers increases through defect levels $E_d$ at the pn junction interface, to largely decrease the open voltage. Therefore, in order to prevent the decrease in the open voltage, it is necessary to match the CBM of the p-type photo-absorbing layer with the CBM of the n-type buffer layer so as to prevent the CBM offset from being negative. On the other hand, where the CBM offset is positive, the CBM offset functions as a barrier to photogenerated carriers. If this barrier becomes too large, the number of carriers to be extracted will decrease, so as to decrease the short-circuit current considerably. The CBM offset to cause the decrease of the short-circuit current is approximately +0.4 eV according to a simulation. Therefore, the appropriate CBM offset for achieving a good balance between the open voltage and the short-circuit current is approximately 0 to +0.4 eV.

From the above-described circumstances, there are desires for realizing an improvement in conversion efficiency by achieving band alignment of the two layers so as to optimize the CBM offset of the wide-gaped p-type photo-absorbing layer and the n-type buffer layer. The inventors considered that the conversion efficiency could be increased by using the n-type buffer layer consisting of any material other than CdS. However, the inventors found that the problems as described below arose when the conventionally known materials were used as the material other than CdS for the n-type buffer layer.

Japanese Patent No. 3249342 proposes forming the n-type buffer layer consisting of Zn(S,O,OH) by the chemical solution growth method (CBD method). In this case, the n-type buffer layer can be formed without use of cadmium harmful to human bodies. However, since the n-type buffer layer consisting of Zn(S,O,OH) is formed by the chemical solution growth method as in the case of CdS, impurities are likely to mix in the n-type buffer layer and it is difficult to control the carrier density which is a significant factor in device design. It is also difficult to control the molar ratio of S and O in the n-type buffer layer in the chemical solution growth method and it is thus difficult to optimize the CBM offset. Furthermore, the p-type photo-absorbing layer is exposed to the atmosphere and solution during formation of the n-type buffer layer, so as to cause oxidation or contamination of the p-type photo-absorbing layer, which can cause defects near the pn junction interface. In addition, a large amount of chemical solution is needed for production of large-area devices like solar cells and the chemical solution used in the formation of the n-type buffer layer cannot be recycled; therefore, huge cost is needed for purchase of the chemical solution and for waste liquid disposal.

Japanese Patent No. 3837114 proposes the n-type buffer layer consisting of ZnMgO. The bandgap of ZnMgO can be controlled by the molar ratio Zn/Mg. However, since MgO has the rock salt structure, the crystallinity of ZnMgO will deteriorate heavily with increase in the percentage of Mg in order to achieve the appropriate band alignment. In addition, since MgO has a very high ion binding property, it is difficult to control the carrier density by adding an impurity in ZnMgO. Furthermore, since ZnMgO has high deliquescence and is a chemically unstable material, it is inferior in reliability as a material making up the n-type buffer layer.

As described above, it was difficult to obtain a desired solar cell even if the materials except for CdS were used for the n-type buffer layer. For this reason, there is no solar cell having the higher open voltage and excellent conversion efficiency, when compared with the CIGS solar cell having the n-type buffer layer consisting of CdS.

The present invention has been accomplished in view of the problems of the conventional technologies and it is an object of the present invention to provide a solar cell with the higher open voltage than the conventional solar cells, and a method for producing the solar cell.

In order to achieve the above object, a solar cell according to the present invention is a solar cell comprising: a p-type semiconductor layer containing a group Ib element, a group IIIb element, and a group VIb element; and an n-type semiconductor layer containing a group Ib element, a group IIIb element, a group VIb element, and Zn and formed on the p-type semiconductor layer, wherein a content of the group Ib element in the n-type semiconductor layer is from 15 to 21 atomic % (hereinafter at. %) to a total number of atoms of the group Ib element, the group IIIb element, the group VIb element, and Zn in the n-type semiconductor layer, and wherein a content of Zn in the n-type semiconductor layer is from 0.005 to 1.0 at. % to the total number of atoms of the group Ib element, the group IIIb element, the group VIb element, and Zn in the n-type semiconductor layer.

In the present invention, the p-type semiconductor layer and the n-type semiconductor layer both contain the group Ib element, the group IIIb element, and the group VIb element, and in this respect the two semiconductor layers have the common composition. For this reason, the present invention is able to suppress formation of defects at the pn junction interface and recombination of photogenerated carriers in defect levels, when compared with the solar cell having the conventional n-type semiconductor layer. In the present invention, since the respective contents of the group Ib element and Zn in the n-type semiconductor layer are within the above numerical ranges, it becomes feasible to increase the carrier density in the n-type semiconductor layer and to form the pn junction with a steep carrier density distribution, without deterioration of crystallinity of the n-type semiconductor layer, when compared with cases where the respective contents of the group Ib element and Zn are off the above numerical ranges. From the reasons described above, the present invention makes it feasible to increase the open voltage, when compared with the solar cell having the conventional n-type semiconductor layer.

In the present invention, preferably, a bandgap of the n-type semiconductor layer is larger than a bandgap of the p-type semiconductor layer. This makes it easier to achieve the band alignment with the optimized CBM offset and to increase the open voltage.

In the present invention, preferably, the group Ib elements in the p-type semiconductor layer and in the n-type semiconductor layer are Cu, the group IIIb elements in the p-type semiconductor layer and in the n-type semiconductor layer are one element or two elements selected from the group consisting of In, Ga, and Al, and the group VIb elements in the p-type semiconductor layer and in the n-type semiconductor layer are at least one element selected from Se and S. When each of the p-type semiconductor layer and the n-type semiconductor layer contains the above-described elements, the effect of the present invention becomes prominent.

In the present invention, preferably, the group IIIb elements in the p-type semiconductor layer and in the n-type semiconductor layer are at least one element selected from In and Ga, and a ratio of the number $N_{Ga}$ of Ga atoms to a total of the number $N_{In}$ of In atoms in the n-type semiconductor layer and the number $N_{Ga}$ of Ga atoms in the n-type semiconductor layer, $N_{Ga}/(N_{In}+N_{Ga})$, is larger than a ratio of the number $P_{Ga}$ of Ga atoms to a total of the number $P_{In}$ of In atoms in the p-type semiconductor layer and the number $P_{Ga}$ of Ga atoms in the p-type semiconductor layer, $P_{Ga}/(P_{In}+P_{Ga})$.

In the present invention, when $N_{Ga}/(N_{In}+N_{Ga})>P_{Ga}/(P_{In}+P_{Ga})$ is met, the bandgap of the n-type semiconductor layer is likely to be larger than the bandgap of the p-type semiconductor layer. For this reason, it becomes easier to achieve the band alignment with the optimized CBM offset and to increase the open voltage.

In the present invention, preferably, the group IIIb elements in the p-type semiconductor layer and in the n-type semiconductor layer are at least one element selected from Ga and Al, and a ratio of the number $N_{Al}$ of Al atoms to a total of the number $N_{Ga}$ of Ga atoms in the n-type semiconductor layer and the number $N_{Al}$ of Al atoms in the n-type semiconductor layer, $N_{Al}/(N_{Ga}+N_{Al})$, is larger than a ratio of the number $P_{Al}$ of Al atoms to a total of the number $P_{Ga}$ of Ga atoms in the p-type semiconductor layer and the number $P_{Al}$ of Al atoms in the p-type semiconductor layer, $P_{Al}/(P_{Ga}+P_{Al})$.

In the present invention, when $N_{Al}/(N_{Ga}+N_{Al})>P_{Al}/(P_{Ga}+P_{Al})$ is met, the bandgap of the n-type semiconductor layer is likely to be larger than the bandgap of the p-type semiconductor layer. For this reason, it is easier to achieve the band alignment with the optimized CBM offset and to increase the open voltage.

In the present invention, preferably, the group IIIb elements in the p-type semiconductor layer and in the n-type semiconductor layer are at least one element selected from In and Al, and a ratio of the number $N_{Al}$ of Al atoms to a total of the number $N_{In}$ of In atoms in the n-type semiconductor layer and the number $N_{Al}$ of Al atoms in the n-type semiconductor layer, $N_{Al}/(N_{In}+N_{Al})$, is larger than a ratio of the number $P_{Al}$ of Al atoms to a total of the number $P_{In}$ of In atoms in the p-type semiconductor layer and the number $P_{Al}$ of Al atoms in the p-type semiconductor layer, $P_{Al}/(P_{In}+P_{Al})$.

In the present invention, when $N_{Al}/(N_{In}+N_{Al})>P_{Al}/(P_{In}+P_{Al})$ is met, the bandgap of the n-type semiconductor layer is likely to be larger than the bandgap of the p-type semiconductor layer. For this reason, it is easier to achieve the band alignment with the optimized CBM offset and to increase the open voltage.

In the present invention, a thickness of the n-type semiconductor layer is preferably from 50 to 200 nm.

If the thickness of the n-type semiconductor layer is less than 50 nm, a short circuit will tend to occur in the solar cell; if the thickness of the n-type semiconductor layer is larger than 200 nm, the open voltage and the short-circuit current will tend to decrease. These tendencies can be suppressed by controlling the thickness of the n-type semiconductor layer within the aforementioned range.

A production method of a solar cell according to the present invention is a method for producing a solar cell, the method comprising: a step of forming a p-type semiconductor layer containing a group Ib element, a group IIIb element, and a group VIb element; and a step of simultaneously depositing a group Ib element, a group IIIb element, a group VIb element, and Zn on the p-type semiconductor layer to form an n-type semiconductor layer on the p-type semiconductor layer, wherein a percentage of the group Ib element to be deposited on the p-type semiconductor layer is from 15 to 21 at. % to a total number of atoms of the group Ib element, the group IIIb element, the group VIb element, and Zn to be deposited on the p-type semiconductor layer, and wherein a percentage of Zn to be deposited on the p-type semiconductor layer is from 0.005 to 1.0 at. % to the total number of atoms of the group Ib element, the group IIIb element, the group VIb element, and Zn to be deposited on the p-type semiconductor layer.

The foregoing production method makes it feasible to readily obtain the solar cell according to the present invention.

In the production method of the solar cell according to the present invention, preferably, the group Ib element in the p-type semiconductor layer is Cu, the group IIIb element in the p-type semiconductor layer is one element or two elements selected from the group consisting of In, Ga, and Al, the group VIb element in the p-type semiconductor layer is at least one element selected from Se and S, the group Ib element to be deposited on the p-type semiconductor layer is Cu, the group IIIb element to be deposited on the p-type semiconductor layer is one element or two elements selected from the group consisting of In, Ga, and Al, and the group VIb element to be deposited on the p-type semiconductor layer is at least one element selected from Se and S.

This makes it feasible to obtain the solar cell with the open voltage considerably increased when compared with the conventional solar cells.

The present invention successfully provides the solar cell with the open voltage increased when compared with the conventional solar cells, and the production method of the solar cell.

DESCRIPTION OF THE PREFERRED EMBODIMENTS

Figure 1:
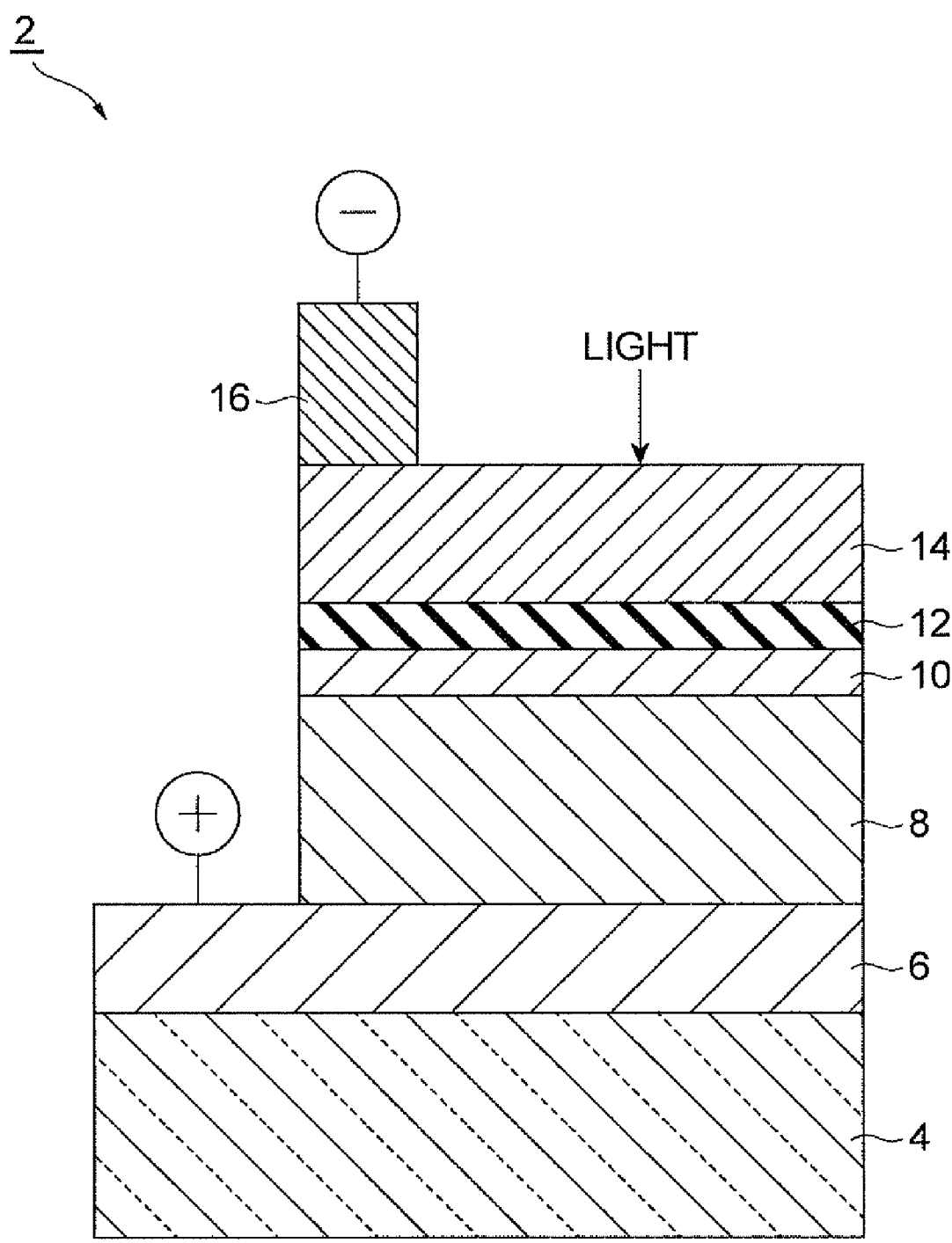
FIG. 1 is a schematic sectional view of a solar cell according to an embodiment of the present invention.

A preferred embodiment of the present invention will be described below in detail with reference to the drawings. In the drawings, identical or equivalent elements will be denoted by the same reference symbols. The vertical and horizontal positional relations are as described in the drawings. The description will be omitted if it is redundant.

(Solar Cell)

As shown in FIG. 1, a solar cell 2 according to the present embodiment is a thin-film solar cell having a soda-lime glass 4 (float glass), a back electrode layer 6 formed on the soda-lime glass 4, a p-type photo-absorbing layer 8 formed on the back electrode layer 6, an n-type buffer layer 10 formed on the p-type photo-absorbing layer 8, a semi-insulating layer 12 formed on the n-type buffer layer 10, a window layer 14 (transparent conductive layer) formed on the semi-insulating layer 12, and a top electrode 16 (extraction electrode) formed on the window layer 14.

The p-type photo-absorbing layer 8 is a p-type compound semiconductor layer consisting of a group Ib element such as Cu, Ag, or Au, a group IIIb element such as B, Al, Ga, In, or Tl, and a group VIb element such as O, S, Se, or Te.

The n-type buffer layer 10 is an n-type compound semiconductor layer consisting of a group Ib element such as Cu, Ag, or Au, a group IIIb element such as B, Al, Ga, In, or Tl, a group VIb element such as O, S, Se, or Te, and Zn.

A content of the group Ib element in the n-type buffer layer 10 is from 15 to 21 at. % to the total number of atoms of the group Ib element, the group IIIb element, the group VIb element, and Zn making up the n-type buffer layer 10. A content of Zn in the n-type buffer layer 10 is from 0.005 to 1.0 at. % to the total number of atoms of the group Ib element, the group IIIb element, the group VIb element, and Zn making up the n-type buffer layer 10. Preferably, Zn is uniformly dispersed in the n-type buffer layer 10. This makes it easier to achieve the effect of the present invention.

If each content of the group Ib element and Zn in the n-type buffer layer 10 is too low, it will be difficult to increase the open voltage. If each content of the group Ib element and Zn is too high, it will also be difficult to increase the open voltage. In the present embodiment, however, because the content of the group Ib element is from 15 to 21 at. % and the content of Zn from 0.005 to 1.0 at. % in the n-type buffer layer 10, the open voltage can be increased.

In the present embodiment, preferably, the group Ib elements making up the p-type photo-absorbing layer 8 and the n-type buffer layer 10 are Cu, the group IIIb elements making up the p-type photo-absorbing layer 8 and the n-type buffer layer 10 are one element or two elements selected from the group consisting of In, Ga, and Al, and the group VIb elements making up the p-type photo-absorbing layer 8 and the n-type buffer layer 10 are at least one element selected from Se and S. The effect of the present invention becomes prominent when each of the p-type semiconductor layer and the n-type semiconductor layer consists of the above-described elements.

The p-type photo-absorbing layer 8 consisting of one element or two elements selected from the group consisting of In, Ga, and Al, at least one element selected from Se and S, and Cu will be referred to hereinafter as "p-CIGS layer 8."

The n-type buffer layer 10 which consists of one element or two elements selected from the group consisting of In, Ga, and Al, at least one element selected from Se and S, Cu, and Zn, in which the percentage of the number of Cu atoms to the total number of atoms of the one element or two elements selected from the group consisting of In, Ga, and Al, at least one element selected from Se and S, Cu, and Zn is from 15 to 21 at. %, and in which the percentage of the number of Zn atoms to the total number of atoms of the one element or two elements selected from the group consisting of In, Ga, and Al, at least one element selected from Se and S, Cu, and Zn is from 0.005 to 1.0 at. %, will be referred to hereinafter as "n-GIGS layer 10."

Specific examples of the p-CIGS layer 8 include layers of such compositions as $CuInSe_2$, $CuGaSe_2$, $Cu(In,Ga)(S,Se)_2$, $CuIn_3Se_5$, $CuGa_3Se_5$, $Cu(In,Ga)_3Se_5$, $Cu(In,Ga)_3(S,Se)_5$, $CuAlSe_2$, $Cu(In,Al)Se_2$, $Cu(Ga,Al)Se_2$, $AgInSe_2$, and $Ag(In,Ga)Se_2$.

Specific examples of the n-CIGS layer 10 include layers of such compositions that the group Ib element is reduced in each of the above compositions listed as the specific examples of the p-CIGS layer 8 and that Zn is added to adjust the content of the group Ib element in the overall composition in the range of 15 to 21 at. % and the content of Zn in the overall composition in the range of 0.005 to 1.0 at. %.

The below will describe the solar cell including the p-CIGS layer 8 and the n-CIGS layer 10.

In the p-CIGS layer 8, the bandgap $E_g$ can be controlled in the range of 1.0 to 1.6 eV and the photo-absorption coefficient can be made larger than $10^5$ cm$^{-1}$ by adjusting the molar ratio of In and Ga, the molar ratio of Ga and Al, or the molar ratio of In and Al. The solar cell having the foregoing p-CIGS layer 8 becomes able to achieve a high conversion efficiency.

In the n-CIGS layer 10, when compared with CIGS frequently used as the material of the conventional p-type semiconductor layer, the content of Cu is smaller and Zn is contained; therefore, the n-CIGS layer 10 comes to have a crystal structure obtained by replacing a part of Cu in the conventional CIGS with Zn. This makes it feasible to increase the concentration of n-type carriers in the n-CIGS layer 10, when compared with the conventional CIGS. When the pn junction is formed using the n-CIGS layer 10 and the p-CIGS layer 8, the carrier density distribution at the pn junction interface becomes steeper than in the solar cell having the conventional CdS layer as the n-type buffer layer, and thus it becomes feasible to increase the open voltage.

If the content of Cu in the n-CIGS layer 10 is too high, the density of n-type carriers will not increase sufficiently despite the inclusion of Zn in the n-CIGS layer 10 and therefore it will be difficult to form the pn junction interface with the steeper carrier density distribution, so as to result in failure in increase of the open voltage. In the present embodiment, however, the content of Cu in the n-CIGS layer 10 is not more than 21 at. % and therefore the above-described problem does not arise, so that the open voltage can be increased when compared with the solar cell using the conventional CdS layer.

The two layers of the p-CIGS layer 8 and the n-CIGS layer 10 have the common composition in that the both layers contain one element or two elements selected from the group consisting of In, Ga, and Al, at least one element selected from Se and S, and Cu. For this reason, the present embodiment, when compared with the solar cell having the conventional CdS layer, is able to suppress the formation of defects at the pn junction interface and the recombination of photogenerated carriers in defect levels (trap levels) and thus to increase the open voltage.

If the content of Cu in the n-CIGS layer 10 is too low, the crystallinity of the n-CIGS layer 10 will degrade, so as to make it easier to form defects at the pn junction interface and to increase the recombination of photogenerated carriers in the defect levels. In this case, the open voltage and the short-circuit current both will decrease. In the present embodiment, however, the content of Cu in the n-CIGS layer 10 is not less than 15 at. % and therefore this problem does not arise, so that the open voltage can be increased when compared with the solar cell using the CdS layer.

When the group IIIb elements in the p-CIGS layer 8 and in the n-CIGS layer 10 are at least one element selected from In and Ga, a ratio of the number $N_{Ga}$ of Ga atoms to the total of the number $N_{In}$ of In atoms in the n-CIGS layer 10 and the number $N_{Ga}$ of Ga atoms in the n-CIGS layer 10, $N_{Ga}/(N_{In}+N_{Ga})$, is preferably larger than a ratio of the number $P_{Ga}$ of Ga atoms to the total of the number $P_{In}$ of In atoms in the p-CIGS layer 8 and the number $P_{Ga}$ of Ga atoms in the p-CIGS layer 8, $P_{Ga}/(P_{In}+P_{Ga})$.

When the group IIIb elements in the p-CIGS layer 8 and in the n-CIGS layer 10 are at least one element selected from Ga and Al, a ratio of the number $N_{Al}$ of Al atoms to the total of the number $N_{Ga}$ of Ga atoms in the n-CIGS layer 10 and the number $N_{Al}$ of Al atoms in the n-CIGS layer 10, $N_{Al}/(N_{Ga}+N_{Al})$, is preferably larger than a ratio of the number $P_{Al}$ of Al atoms to the total of the number $P_{Ga}$ of Ga atoms in the p-CIGS layer 8 and the number $P_{Al}$ of Al atoms in the p-CIGS layer 8, $P_{Al}/(P_{Ga}+P_{Al})$.

When the group IIIb elements in the p-CIGS layer 8 and in the n-CIGS layer 10 are at least one element selected from In and Al, a ratio of the number $N_{Al}$ of Al atoms to the total of the number $N_{In}$ of In atoms in the n-CIGS layer 10 and the number $N_{Al}$ of Al atoms in the n-CIGS layer 10, $N_{Al}/(N_{In}+N_{Al})$, is preferably larger than a ratio of the number $P_{Al}$ of Al atoms to the total of the number $P_{In}$ of In atoms in the p-CIGS layer 8 and the number $P_{Al}$ of Al atoms in the p-CIGS layer 8, $P_{Al}/(P_{In}+P_{Al})$.

A ratio of the number $N_S$ of S atoms to the total of the number $N_{Se}$ of Se atoms in the n-CIGS layer 10 and the number $N_S$ of S atoms in the n-CIGS layer 10, $N_S/(N_{Se}+N_S)$, is preferably larger than a ratio of the number $P_S$ of S atoms to the total of the number $P_{Se}$ of Se atoms in the p-CIGS layer 8 and the number $P_S$ of S atoms in the p-CIGS layer 8, $P_S/(P_{Se}+P_S)$.

When any one inequality is met among $N_{Ga}/(N_{In}+N_{Ga})>P_{Ga}/(P_{In}+P_{Ga})$, $N_{Al}/(N_{Ga}+N_{Al})>P_{Al}/(P_{Ga}+P_{Al})$, $N_{Al}/(N_{In}+N_{Al})>P_{Al}/(P_{In}+P_{Al})$, and $N_S/(N_{Se}+N_S)>P_S/(P_{Se}+P_S)$, the bandgap of the n-CIGS layer 10 tends to become larger than the bandgap of the p-CIGS layer 8.

Figure 2:
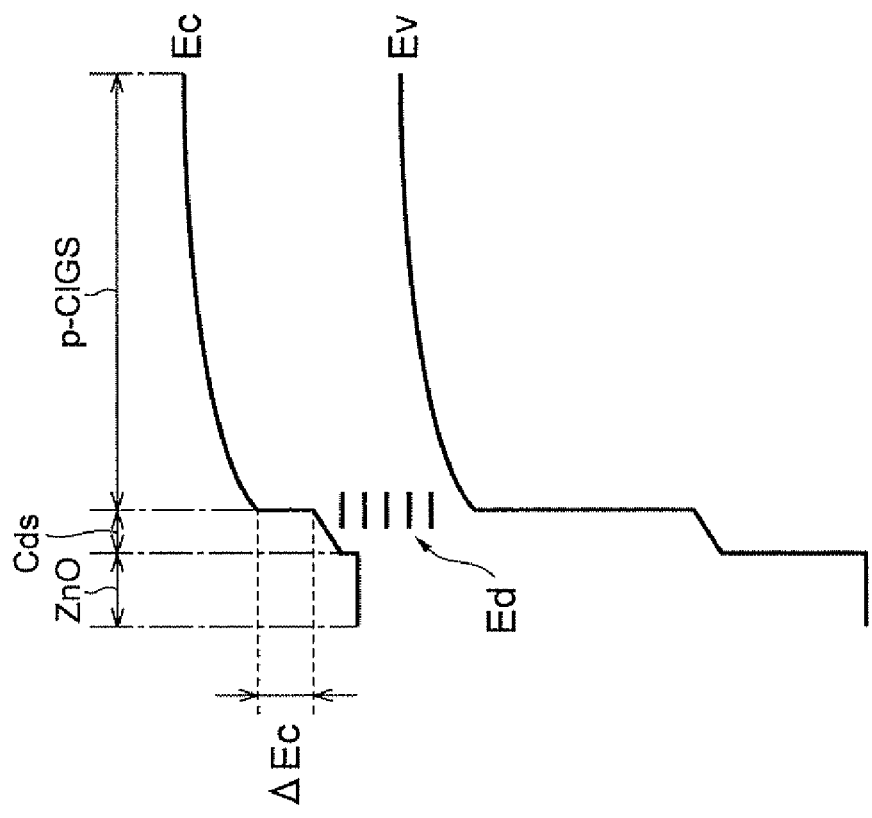
FIG. 2A is a schematic view of a band structure of a solar cell according to an embodiment of the present invention.
FIG. 2B is a schematic view of a band structure of a conventional solar cell having the n-type buffer layer consisting of CdS.
Figure 2:
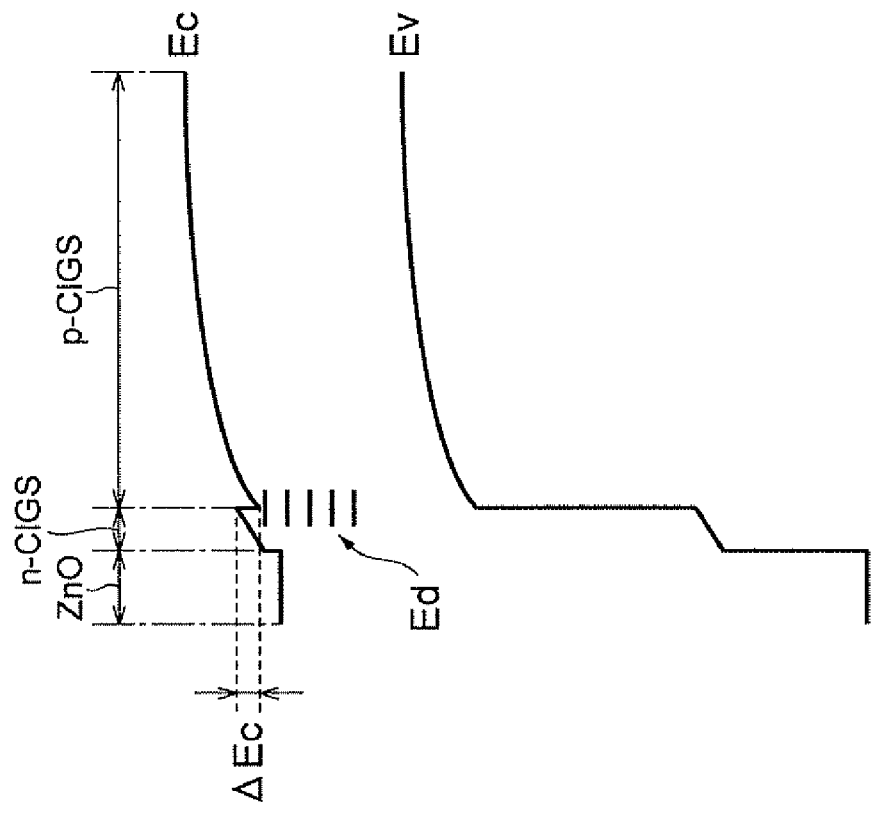

When the bandgap of the n-CIGS layer 10 is larger than the bandgap of the p-CIGS layer 8, the band alignment with the optimized CBM offset of the p-CIGS layer 8 and the n-CIGS layer 10 is achieved even if $E_g$ of the p-CIGS layer 8 is wide-gapped to about 1.4-1.5 eV. For example, as shown in FIG. 2A, the CBM offset $\Delta E_c$ can be made positive and the CBM offset $\Delta E_c$ can also be controlled in the optimum range of approximately 0 to +0.4 eV. When the CBM offset $\Delta E_c$ is optimized, the recombination of majority carriers through the defect levels $E_d$ at the pn junction interface is suppressed and the CBM offset $\Delta E_c$ is unlikely to become a barrier to photogenerated carriers. As a result, the present embodiment achieves increase in the open voltage and facilitates increase in the short-circuit current and the fill factor F.F. and improvement in the conversion efficiency. As the bandgap of the n-CIGS layer 10 becomes larger, the diffusion potential increases so as to make it easier to increase the open voltage and the transmittance of light in the n-CIGS layer 10 becomes higher so as to make it easier to increase the short-circuit current.

The average thickness of the n-CIGS layer 10 is preferably from 50 to 200 nm. If the n-CIGS layer 10 is too thin, there will be a portion not covered by the n-CIGS layer 10 on the surface of the p-CIGS layer 8 and a short circuit can occur at the portion to make it difficult to generate electricity. If the n-CIGS layer 10 is too thick on the other hand, the probability of recombination of generated carriers will increase in the n-CIGS layer 10 and the open voltage and the short-circuit current both will tend to decrease.

(Method for Producing Solar Cell)

In the present embodiment, first, the back electrode layer 6 is formed on the soda-lime glass 4. The back electrode layer 6 is usually a metal layer consisting of Mo. A method of forming the back electrode layer 6 is, for example, sputtering of a Mo target or the like.

After the back electrode layer 6 is formed on the soda-lime glass 4, the p-CIGS layer 8 is formed on the back electrode layer 6. In the present embodiment, the p-CIGS layer 8 is formed by an evaporation method such as the one-stage co-evaporation process (one step method) or the three-stage co-evaporation process (NREL method). Thereafter, the n-CIGS layer 10 is formed on the p-CIGS layer 8 by an evaporation method, in the same manner as in the case of the p-CIGS layer 8.

The step of forming the n-CIGS layer 10 is to simultaneously evaporate one element or two elements selected from the group consisting of In, Ga, and Al, at least one element selected from Se and S, Cu, and Zn on the p-CIGS layer 8. The percentage of Cu to be deposited on the p-CIGS layer 8 is adjusted in the range of 15 to 21 at. %, relative to the total number of atoms of the one element or two elements selected from the group consisting of In, Ga, and Al, at least one element selected from Se and S, Cu, and Zn to be deposited on the p-CIGS layer 8. Furthermore, the percentage of Zn to be deposited on the p-CIGS layer 8 is adjusted in the range of 0.005 to 1.0 at. %, relative to the total number of atoms of the one element or two elements selected from the group consisting of In, Ga, and Al, at least one element selected from Se and S, Cu, and Zn to be deposited on the p-CIGS layer 8. The above permits the n-CIGS layer 10 to be formed with a desired uniform composition.

The composition of the n-CIGS layer 10 is determined by the percentages of the respective elements to all the elements deposited on the p-CIGS layer 8. The percentage of each element can be controlled, for example, by adjusting a flux (evaporation amount) of a deposition source (evaporation source) of each element or a deposition time. The thickness of the n-CIGS layer 10 can also be controlled, for example, by adjusting the flux (evaporation amount) or the deposition time.

In the step of forming the p-CIGS layer 8 by the evaporation method, the temperature of the substrate is preferably from 200 to 500° C. and more preferably from 400 to 500° C. The "substrate" herein is a body subjected to evaporation in the evaporation process and the substrate in the step of forming the p-CIGS layer 8 corresponds to the soda-lime glass 4 and the back electrode layer 6.

When the temperature of the substrate is too low, the p-CIGS layer 8 tends to peel off the back electrode layer 6. If the temperature of the substrate is too high on the other hand, the soda-lime glass 4, the back electrode layer 6, or the p-CIGS layer 8 tends to soften and deform. These tendencies can be restrained by setting the temperature of the substrate within the foregoing range.

In the step of forming the n-CIGS layer 10 by the co-evaporation method, the temperature of the substrate is also preferably from 200 to 500° C. and more preferably from 400 to 500° C., in order to suppress peeling or deformation of the n-CIGS layer 10. The substrate in the step of forming the n-CIGS layer 10 corresponds to the soda-lime glass 4, the back electrode layer 6, and the p-CIGS layer 8.

Since the evaporation method allows the elements to be supplied separately to the substrate, it is easy to control the composition of each of the p-CIGS layer 8 and the n-CIGS layer 10. When the n-CIGS layer 10 is formed by the co-evaporation method, different from the sputtering method, the surface of the p-CIGS layer 8 is not damaged by a plasma that is to be generated in the sputtering, and therefore the defect levels are unlikely to be formed at the pn junction interface in the solar cell 2. Furthermore, the evaporation method is less likely to cause contamination of the interface due to impurities which can be a problem in the case of the chemical solution growth method. When the n-CIGS layer 10 is formed by the co-evaporation of all the elements, there is no need for carrying out a thermal treatment after the evaporation and thus this method is free from the problem that Zn in the n-CIGS layer 10 thermally diffuses into the p-CIGS layer 8 during the thermal treatment. The evaporation method is thus preferred in these respects.

In the present embodiment, it is preferable to sequentially perform the formation of the p-CIGS layer 8 by the evaporation method and the formation of the n-CIGS layer 10 by the co-evaporation method in an evaporation system. After the p-CIGS layer 8 is formed in the evaporation system, the n-CIGS layer 10 is formed without opening the interior of the evaporation system, whereby it is feasible to prevent contamination of the surface of the p-CIGS layer 8 and deterioration of crystallinity thereof and to suppress formation of the defect levels at the pn junction interface of the resultant solar cell 2.

After the formation of the n-CIGS layer 10, the semi-insulating layer 12 is formed on the n-CIGS layer 10, the window layer 14 is formed on the semi-insulating layer 12, and the top electrode 16 is formed on the window layer 14. This completes the solar cell 2. An antireflection layer consisting of $MgF_2$ may be optionally formed on the window layer 14.

The semi-insulating layer 12 can be, for example, an i-ZnO layer. The window layer 14 can be, for example, ZnO:B or ZnO:Al. The top electrode 16 consists, for example, of metal such as Al or Ni. The semi-insulating layer 12, the window layer 14, and the top electrode 16 can be formed, for example, by sputtering or by MOCVD.

The above detailed the preferred embodiment of the present invention, but it should be noted that the present invention is by no means limited to the above embodiment.

For example, each of the p-CIGS layer 8 and the n-CIGS layer 10 may be formed by the solid phase selenization method, the vapor phase selenization method, or the sputtering method. In this case, the solar cell 2 according to the above embodiment can also be produced. However, in order to make the effect of the present invention prominent, it is most preferable to form the p-CIGS layer 8 by the evaporation method and to form the n-CIGS layer 10 by the co-evaporation method, subsequent to the formation of the p-CIGS layer 8.

EXAMPLES

The present invention will be described below in more detail on the basis of Examples and Comparative Examples, but the present invention is by no means intended to be limited to the examples below.

Example 1

A soda-lime glass 10 cm vertical, 10 cm horizontal, and 1 mm thick was cleaned and dried and the back electrode of a film shape consisting of Mo alone was formed on the soda-lime glass by sputtering. The thickness of the back electrode was 1 μm.

Prior to the formation of the p-CIGS layer using a vacuum evaporation system, the fluxes of the respective evaporation sources employed in the three-stage evaporation method for formation of the p-CIGS layer (which will be referred to hereinafter as "p-layer fluxes") were preliminarily set as described below. Furthermore, temperatures of K cells were also controlled so as to obtain the respective stable p-layer fluxes. The arrival vacuum degree of the vacuum evaporation system was $1.0 \times 10^{-6}$ Pa.

<p-Layer Fluxes>
Cu: $5.0 \times 10^{-5}$ Pa.
In: $1.0 \times 10^{-4}$ Pa.
Ga: $1.0 \times 10^{-5}$ Pa.
Se: $3.0 \times 10^{-3}$ Pa.

The fluxes of the respective evaporation sources employed in the co-evaporation method for formation of the n-CIGS layer using the aforementioned vacuum evaporation system (which will be referred to hereinafter as "n-layer fluxes") were preliminarily set as described below. Temperatures of K cells with the respective evaporation sources therein were also controlled in order to obtain the respective stable n-layer fluxes. The arrival vacuum degree of the vacuum evaporation system was $1.0 \times 10^{-6}$ Pa.

<n-Layer Fluxes>
Cu: $1.8 \times 10^{-5}$ Pa.
Ga: $3.0 \times 10^{-5}$ Pa.
S: $3.0 \times 10^{-3}$ Pa.
Zn: $2.0 \times 10^{-6}$ Pa.

The back electrode formed on the soda-lime glass was set in the vacuum evaporation system, the interior of the chamber was evacuated, and thereafter the three-stage evaporation method described below was carried out using the p-layer fluxes.

In the first stage, the substrate was heated up to 300° C., and shutters of the respective K cells of In, Ga, and Se were opened to evaporate In, Ga, and Se on the back electrode. When a layer about 1 μm thick was formed on the back electrode by this evaporation, the shutters of the respective K cells of In and Ga were closed to terminate the evaporation of In and Ga. In Example 1, the "substrate" means a body subjected to evaporation in each evaporation step.

In the second stage, the substrate was heated up to 520° C., and then the shutter of the K cell of Cu was opened to evaporate Se and Cu on the back electrode. In the second stage and the third stage described below, the power for heating the substrate was constant and there was no feedback of temperature values to power. In the second stage, the surface temperature of the substrate was monitored with a radiation thermometer and, immediately after confirming that the temperature rise of the substrate stopped and a drop of temperature started, the shutter of the K cell of Cu was closed to terminate the evaporation of Cu. At the point of completion of the evaporation in the second stage, the thickness of the layer formed on the back electrode was increased by about 0.8 μm, when compared with that at the point of the completion of the evaporation in the first stage.

In the third stage, the shutters of the respective K cells of In and Ga were opened again to evaporate In, Ga, and Se on the back electrode as in the first stage. When the thickness of the layer formed on the back electrode was increased by about 0.2 μm from that at the point of the start of the evaporation in the third stage, the shutters of the respective K cells of In, Ga, and Se were closed to terminate the evaporation in the third stage.

The p-CIGS layer having the composition represented by $CuIn_{0.7}Ga_{0.3}Se_2$ was formed by the above-described three-stage evaporation method.

Subsequent to the formation of the p-CIGS layer, the substrate temperature was set at 400° C. in the same vacuum evaporation system and Cu, Ga, S, and Zn all were simultaneously evaporated on the p-CIGS layer, using the respective n-layer fluxes, to form the n-CIGS layer on the p-CIGS layer. It was confirmed that the resultant n-CIGS layer consisted of Cu, Ga, S, and Zn. A ratio of the number of moles of Ga and the number of moles of S in the n-CIGS layer was 1:2. The content of Cu in the n-CIGS layer was 15.1 at. % relative to all the elements of Cu, Ga, S, and Zn. The content of Zn in the n-CIGS layer was 0.006 at. % relative to all the elements of Cu, Ga, S, and Zn.

After the formation of the n-GIGS layer, an i-ZnO layer (semi-insulating layer) 50 nm thick was formed on the n-CIGS layer. A ZnO:Al layer (window layer) 1 μm thick was formed on the i-ZnO layer. A collector electrode (top electrode) consisting of Al and having the thickness of 500 nm was formed on the ZnO:Al layer. The i-ZnO layer, the ZnO:Al layer, and the collector electrode each were formed by sputtering. This completed the thin-film solar cell of Example 1.

Comparative Example 1

In Comparative Example 1, as in Example 1, the back electrode was formed on the soda-lime glass and the p-CIGS layer was formed on the back electrode. Subsequent to the formation of the p-CIGS layer, Cd was evaporated on the surface of the p-CIGS layer in the same vacuum evaporation system and was thermally diffused into the p-CIGS layer. This converted the surface of the p-CIGS layer into the n-type to form a pn junction. During execution of the evaporation of Cd, the temperature of the substrate was set at 400° C. and a flux of Cd was set to $1.0 \times 10^{-5}$ Pa. The i-ZnO layer, ZnO:Al layer, and collector electrode were formed on the n-typed surface of the p-CIGS layer, each by the same method as in Example 1, to obtain the thin-film solar cell of Comparative Example 1.

Examples 2-20 and Comparative Examples 2-23

The thin-film solar cells of Examples 2-20 and Comparative Examples 2-23 were produced by the same method as in Example 1, except that the respective fluxes of Cu and Zn as the n-layer fluxes were preliminarily set to the values shown in Tables 1 and 2. The respective contents of Cu and Zn in the n-CIGS layer in each of the thin-film solar cells of Examples 2-20 and Comparative Examples 2-23 were the values shown in Tables 1 and 2. The notation of "E-0N" (N is a natural number) in Tables 1 to 6 below means "$\times 10^{-N}$."

(Evaluation of Thin-Film Solar Cells)

Figure 3:
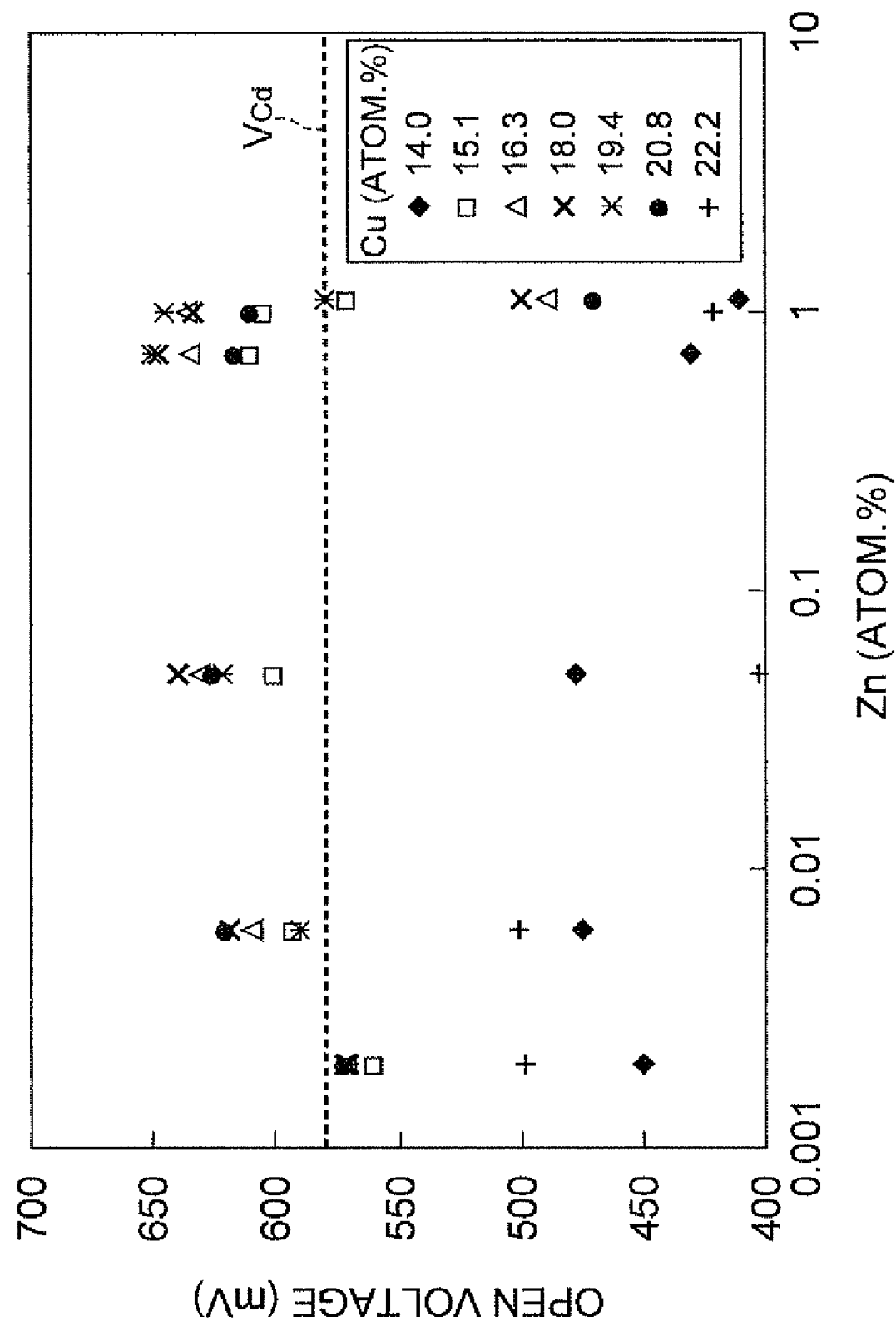
FIG. 3 is a graph showing a relation of respective contents of Cu and Zn in an n-type semiconductor layer containing Ga as a group IIIb element and S as a group VIb element, with the open voltage for each of solar cells.

The open voltage was determined with each of the thin-film solar cells of Examples 1-20 and Comparative Examples 1-23. The results are provided in Tables 1 and 2. FIG. 3 shows a graph showing a relation of the contents of Cu and Zn in the n-CIGS layer with the open voltage corresponding thereto for each of the thin-film solar cells of Examples 1-20 and Comparative Examples 1-23. "$V_{Cd}$" in FIG. 3 and in FIGS. 4 and 5 described below means the open voltage of Comparative Example 1 and the value thereof is 580 mV.

TABLE 1

| | Fluxes (Pa) | | Contents (atom. %) | | Open voltage |
|---|---|---|---|---|---|
| | Cu | Zn | Cu | Zn | (mV) |
| Comparative Example 1 | — | — | — | — | 580 |
| Comparative Example 2 | 1.0E−05 | 1.0E−06 | 14 | 0.002 | 450 |
| Comparative Example 3 | 1.0E−05 | 2.0E−06 | 14 | 0.006 | 475 |
| Comparative Example 4 | 1.0E−05 | 3.0E−06 | 14 | 0.05 | 477 |
| Comparative Example 5 | 1.0E−05 | 6.0E−06 | 14 | 0.7 | 430 |
| Comparative Example 6 | 1.0E−05 | 8.0E−06 | 14 | 0.99 | 399 |
| Comparative Example 7 | 1.0E−05 | 1.0E−05 | 14 | 1.12 | 411 |
| Comparative Example 8 | 1.8E−05 | 1.0E−06 | 15.1 | 0.002 | 560 |
| Example 1 | 1.8E−05 | 2.0E−06 | 15.1 | 0.006 | 592 |
| Example 2 | 1.8E−05 | 3.0E−06 | 15.1 | 0.05 | 600 |
| Example 3 | 1.8E−05 | 6.0E−06 | 15.1 | 0.7 | 609 |
| Example 4 | 1.8E−05 | 8.0E−06 | 15.1 | 0.99 | 605 |
| Comparative Example 9 | 1.8E−05 | 1.0E−05 | 15.1 | 1.12 | 570 |
| Comparative Example 10 | 2.5E−05 | 1.0E−06 | 16.3 | 0.002 | 571 |
| Example 5 | 2.5E−05 | 2.0E−06 | 16.3 | 0.006 | 610 |
| Example 6 | 2.5E−05 | 3.0E−06 | 16.3 | 0.05 | 630 |
| Example 7 | 2.5E−05 | 6.0E−06 | 16.3 | 0.7 | 635 |
| Example 8 | 2.5E−05 | 8.0E−06 | 16.3 | 0.99 | 636 |
| Comparative Example 11 | 2.5E−05 | 1.0E−05 | 16.3 | 1.12 | 489 |
| Comparative Example 12 | 3.6E−05 | 1.0E−06 | 18 | 0.002 | 572 |
| Example 9 | 3.6E−05 | 2.0E−06 | 18 | 0.006 | 619 |
| Example 10 | 3.6E−05 | 3.0E−06 | 18 | 0.05 | 640 |
| Example 11 | 3.6E−05 | 6.0E−06 | 18 | 0.7 | 648 |
| Example 12 | 3.6E−05 | 8.0E−06 | 18 | 0.99 | 633 |
| Comparative Example 13 | 3.6E−05 | 1.0E−05 | 18 | 1.12 | 499 |

TABLE 2

| | Fluxes (Pa) | | Contents (atom. %) | | Open voltage |
|---|---|---|---|---|---|
| | Cu | Zn | Cu | Zn | (mV) |
| Comparative Example 14 | 4.2E−05 | 1.0E−06 | 19.4 | 0.002 | 570 |
| Example 13 | 4.2E−05 | 2.0E−06 | 19.4 | 0.006 | 590 |
| Example 14 | 4.2E−05 | 3.0E−06 | 19.4 | 0.05 | 621 |
| Example 15 | 4.2E−05 | 6.0E−06 | 19.4 | 0.7 | 650 |
| Example 16 | 4.2E−05 | 8.0E−06 | 19.4 | 0.99 | 645 |
| Comparative Example 15 | 4.2E−05 | 1.0E−05 | 19.4 | 1.12 | 580 |
| Comparative Example 16 | 5.0E−05 | 1.0E−06 | 20.8 | 0.002 | 572 |
| Example 17 | 5.0E−05 | 2.0E−06 | 20.8 | 0.006 | 620 |
| Example 18 | 5.0E−05 | 3.0E−06 | 20.8 | 0.05 | 625 |
| Example 19 | 5.0E−05 | 6.0E−06 | 20.8 | 0.7 | 616 |
| Example 20 | 5.0E−05 | 8.0E−06 | 20.8 | 0.99 | 609 |
| Comparative Example 17 | 5.0E−05 | 1.0E−05 | 20.8 | 1.12 | 469 |
| Comparative Example 18 | 6.0E−05 | 1.0E−06 | 22.2 | 0.002 | 498 |
| Comparative Example 19 | 6.0E−05 | 2.0E−06 | 22.2 | 0.006 | 501 |
| Comparative Example 20 | 6.0E−05 | 3.0E−06 | 22.2 | 0.05 | 402 |
| Comparative Example 21 | 6.0E−05 | 6.0E−06 | 22.2 | 0.7 | 390 |
| Comparative Example 22 | 6.0E−05 | 8.0E−06 | 22.2 | 0.99 | 421 |
| Comparative Example 23 | 6.0E−05 | 1.0E−05 | 22.2 | 1.12 | 338 |

Examples 21-40 and Comparative Examples 24-45

In Examples 21-40 and Comparative Examples 24-45, Cu, In, Ga, Se, and Zn were used as evaporation sources for formation of the n-CIGS layer. The respective fluxes of Cu and Zn as the n-layer fluxes were preliminarily set to the values shown in Tables 3 and 4. The respective fluxes of In, Ga, and Se as the n-layer fluxes were preliminarily set as described below.

In: $1.0 \times 10^{-4}$ Pa.
Ga: $4.0 \times 10^{-5}$ Pa.
Se: $3.0 \times 10^{-3}$ Pa.

The thin-film solar cells of Examples 21-40 and Comparative Examples 24-45 were produced by the same method as in Example 1, except for the above-described matters. It was confirmed that the n-CIGS layer in each of the thin-film solar cells of Examples 21-40 and Comparative Examples 24-45 consisted of Cu, In, Ga, Se, and Zn. A ratio of the number of moles of Se to the total number of moles of In and Ga in the n-CIGS layer was 1:2. The respective contents of Cu and Zn in the n-CIGS layer were the values shown in Tables 3 and 4, relative to all the elements of Cu, In, Ga, Se, and Zn.

(Evaluation of Thin-Film Solar Cells)

Figure 4:
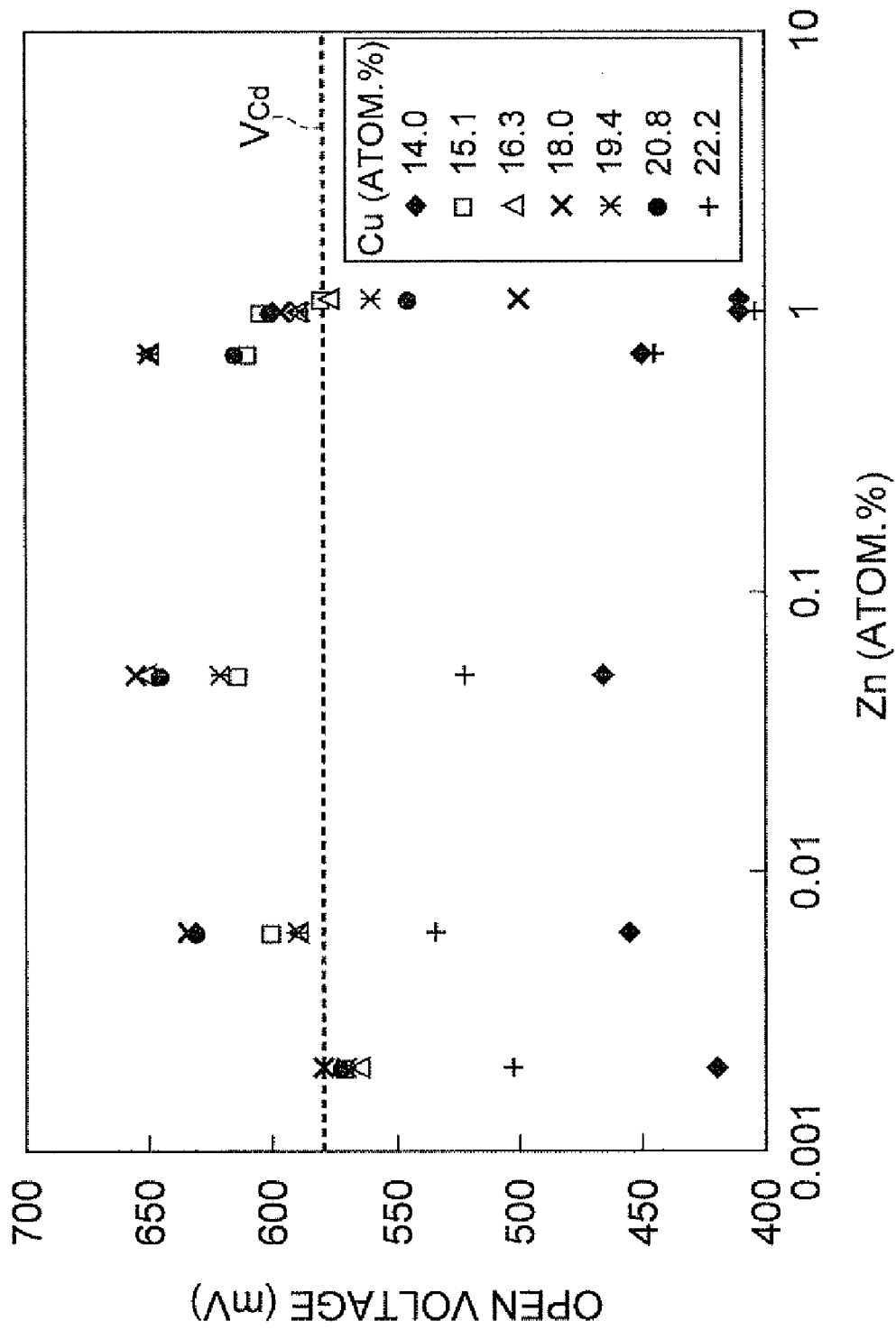
FIG. 4 is a graph showing a relation of respective contents of Cu and Zn in an n-type semiconductor layer containing Ga and In as group IIIb elements and Se as a group VIb element, with the open voltage for each of solar cells.

The open voltage of each of the thin-film solar cells of Examples 21-40 and Comparative Examples 24-45 was determined by the same method as in Example 1. The results are provided in Tables 3 and 4. FIG. 4 shows a graph showing a relation of the respective contents of Cu and Zn in the n-CIGS layer with the open voltage corresponding thereto for each of the thin-film solar cells of Examples 21-40 and Comparative Examples 24-45.

TABLE 3

| | Fluxes (Pa) | | Contents (atom. %) | | Open voltage |
|---|---|---|---|---|---|
| | Cu | Zn | Cu | Zn | (mV) |
| Comparative Example 24 | 1.0E−05 | 1.0E−06 | 14 | 0.002 | 420 |
| Comparative Example 25 | 1.0E−05 | 2.0E−06 | 14 | 0.006 | 455 |
| Comparative Example 26 | 1.0E−05 | 3.0E−06 | 14 | 0.05 | 466 |
| Comparative Example 27 | 1.0E−05 | 6.0E−06 | 14 | 0.7 | 450 |
| Comparative Example 28 | 1.0E−05 | 8.0E−06 | 14 | 0.99 | 410 |
| Comparative Example 29 | 1.0E−05 | 1.0E−05 | 14 | 1.12 | 411 |
| Comparative Example 30 | 1.8E−05 | 1.0E−06 | 15.1 | 0.002 | 570 |
| Example 21 | 1.8E−05 | 2.0E−06 | 15.1 | 0.006 | 600 |
| Example 22 | 1.8E−05 | 3.0E−06 | 15.1 | 0.05 | 614 |
| Example 23 | 1.8E−05 | 6.0E−06 | 15.1 | 0.7 | 609 |
| Example 24 | 1.8E−05 | 8.0E−06 | 15.1 | 0.99 | 605 |
| Comparative Example 31 | 1.8E−05 | 1.0E−05 | 15.1 | 1.12 | 580 |
| Comparative Example 32 | 2.5E−05 | 1.0E−06 | 16.3 | 0.002 | 565 |
| Example 25 | 2.5E−05 | 2.0E−06 | 16.3 | 0.006 | 590 |
| Example 26 | 2.5E−05 | 3.0E−06 | 16.3 | 0.05 | 651 |

TABLE 3-continued

| | Fluxes (Pa) | | Contents (atom. %) | | Open voltage |
|---|---|---|---|---|---|
| | Cu | Zn | Cu | Zn | (mV) |
| Example 27 | 2.5E−05 | 6.0E−06 | 16.3 | 0.7 | 650 |
| Example 28 | 2.5E−05 | 8.0E−06 | 16.3 | 0.99 | 590 |
| Comparative Example 33 | 2.5E−05 | 1.0E−05 | 16.3 | 1.12 | 577 |
| Comparative Example 34 | 3.6E−05 | 1.0E−06 | 18 | 0.002 | 580 |
| Example 29 | 3.6E−05 | 2.0E−06 | 18 | 0.006 | 634 |
| Example 30 | 3.6E−05 | 3.0E−06 | 18 | 0.05 | 655 |
| Example 31 | 3.6E−05 | 6.0E−06 | 18 | 0.7 | 650 |
| Example 32 | 3.6E−05 | 8.0E−06 | 18 | 0.99 | 596 |
| Comparative Example 35 | 3.6E−05 | 1.0E−05 | 18 | 1.12 | 499 |

TABLE 4

| | Fluxes (Pa) | | Contents (atom. %) | | Open voltage |
|---|---|---|---|---|---|
| | Cu | Zn | Cu | Zn | (mV) |
| Comparative Example 36 | 4.2E−05 | 1.0E−06 | 19.4 | 0.002 | 570 |
| Example 33 | 4.2E−05 | 2.0E−06 | 19.4 | 0.006 | 590 |
| Example 34 | 4.2E−05 | 3.0E−06 | 19.4 | 0.05 | 621 |
| Example 35 | 4.2E−05 | 6.0E−06 | 19.4 | 0.7 | 650 |
| Example 36 | 4.2E−05 | 8.0E−06 | 19.4 | 0.99 | 588 |
| Comparative Example 37 | 4.2E−05 | 1.0E−05 | 19.4 | 1.12 | 560 |
| Comparative Example 38 | 5.0E−05 | 1.0E−06 | 20.8 | 0.002 | 572 |
| Example 37 | 5.0E−05 | 2.0E−06 | 20.8 | 0.006 | 630 |
| Example 38 | 5.0E−05 | 3.0E−06 | 20.8 | 0.05 | 645 |
| Example 39 | 5.0E−05 | 6.0E−06 | 20.8 | 0.7 | 615 |
| Example 40 | 5.0E−05 | 8.0E−06 | 20.8 | 0.99 | 600 |
| Comparative Example 39 | 5.0E−05 | 1.0E−05 | 20.8 | 1.12 | 544 |
| Comparative Example 40 | 6.0E−05 | 1.0E−06 | 22.2 | 0.002 | 502 |
| Comparative Example 41 | 6.0E−05 | 2.0E−06 | 22.2 | 0.006 | 533 |
| Comparative Example 42 | 6.0E−05 | 3.0E−06 | 22.2 | 0.05 | 522 |
| Comparative Example 43 | 6.0E−05 | 6.0E−06 | 22.2 | 0.7 | 444 |
| Comparative Example 44 | 6.0E−05 | 8.0E−06 | 22.2 | 0.99 | 404 |
| Comparative Example 45 | 6.0E−05 | 1.0E−05 | 22.2 | 1.12 | 348 |

Examples 41-60 and Comparative Examples 46-67

In Examples 41-60 and Comparative Examples 46-67, Cu, In, Ga, S, and Zn were used as evaporation sources for formation of the n-CIGS layer. The respective fluxes of Cu and Zn as the n-layer fluxes were preliminarily set to the values shown in Tables 5 and 6. The respective fluxes of In, Ga, and S as the n-layer fluxes were preliminarily set as described below.

In: $1.0 \times 10^{-4}$ Pa
Ga: $4.0 \times 10^{-5}$ Pa.
S: $3.0 \times 10^{-3}$ Pa.

The thin-film solar cells of Examples 41-60 and Comparative Examples 46-67 were produced by the same method as in Example 1, except for the above matters. It was confirmed that the n-CIGS layer in each of the thin-film solar cells of Examples 41-60 and Comparative Examples 46-67 consisted of Cu, In, Ga, S, and Zn. A ratio of the number of moles of S to the total number of moles of In and Ga in the n-CIGS layer was 1:2. The respective contents of Cu and Zn in the n-CIGS layer were the values shown in Tables 5 and 6, relative to all the elements of Cu, In, Ga, S, and Zn.

(Evaluation of Thin-Film Solar Cells)

Figure 5:
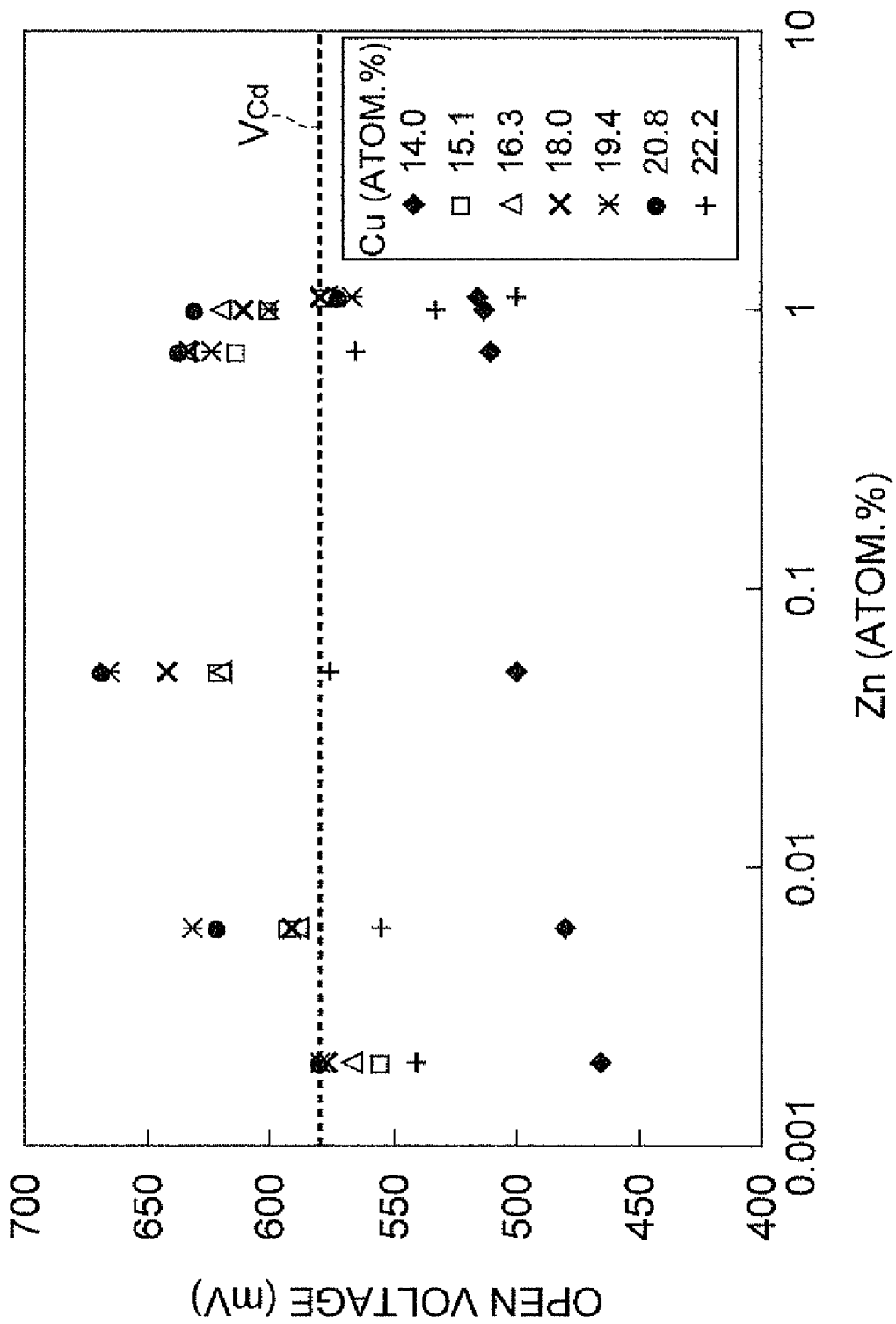
FIG. 5 is a graph showing a relation of respective contents of Cu and Zn in an n-type semiconductor layer containing Ga and In as group IIIb elements and S as a group VIb element, with the open voltage for each of solar cells.

The open voltage of each of the thin-film solar cells of Examples 41-60 and Comparative Examples 46-67 was determined by the same method as in Example 1. The results are provided in Tables 5 and 6. FIG. 5 shows a graph showing a relation of the respective contents of Cu and Zn in the n-CIGS layer with the open voltage corresponding thereto for each of the thin-film solar cells of Examples 41-67 and Comparative Examples 46-67.

TABLE 5

| | Fluxes (Pa) | | Contents (atom. %) | | Open voltage |
|---|---|---|---|---|---|
| | Cu | Zn | Cu | Zn | (mV) |
| Comparative Example 46 | 1.0E−05 | 1.0E−06 | 14 | 0.002 | 465 |
| Comparative Example 47 | 1.0E−05 | 2.0E−06 | 14 | 0.006 | 480 |
| Comparative Example 48 | 1.0E−05 | 3.0E−06 | 14 | 0.05 | 499 |
| Comparative Example 49 | 1.0E−05 | 6.0E−06 | 14 | 0.7 | 510 |
| Comparative Example 50 | 1.0E−05 | 8.0E−06 | 14 | 0.99 | 513 |
| Comparative Example 51 | 1.0E−05 | 1.0E−05 | 14 | 1.12 | 515 |
| Comparative Example 52 | 1.8E−05 | 1.0E−06 | 15.1 | 0.002 | 555 |
| Example 41 | 1.8E−05 | 2.0E−06 | 15.1 | 0.006 | 592 |
| Example 42 | 1.8E−05 | 3.0E−06 | 15.1 | 0.05 | 621 |
| Example 43 | 1.8E−05 | 6.0E−06 | 15.1 | 0.7 | 613 |
| Example 44 | 1.8E−05 | 8.0E−06 | 15.1 | 0.99 | 600 |
| Comparative Example 53 | 1.8E−05 | 1.0E−05 | 15.1 | 1.12 | 577 |
| Comparative Example 54 | 2.5E−05 | 1.0E−06 | 16.3 | 0.002 | 566 |
| Example 45 | 2.5E−05 | 2.0E−06 | 16.3 | 0.006 | 588 |
| Example 46 | 2.5E−05 | 3.0E−06 | 16.3 | 0.05 | 620 |
| Example 47 | 2.5E−05 | 6.0E−06 | 16.3 | 0.7 | 635 |
| Example 48 | 2.5E−05 | 8.0E−06 | 16.3 | 0.99 | 620 |
| Comparative Example 55 | 2.5E−05 | 1.0E−05 | 16.3 | 1.12 | 577 |
| Comparative Example 56 | 3.6E−05 | 1.0E−06 | 18 | 0.002 | 577 |
| Example 49 | 3.6E−05 | 2.0E−06 | 18 | 0.006 | 591 |
| Example 50 | 3.6E−05 | 3.0E−06 | 18 | 0.05 | 642 |
| Example 51 | 3.6E−05 | 6.0E−06 | 18 | 0.7 | 633 |
| Example 52 | 3.6E−05 | 8.0E−06 | 18 | 0.99 | 611 |
| Comparative Example 57 | 3.6E−05 | 1.0E−05 | 18 | 1.12 | 580 |

TABLE 6

| | Fluxes (Pa) | | Contents (atom. %) | | Open voltage |
|---|---|---|---|---|---|
| | Cu | Zn | Cu | Zn | (mV) |
| Comparative Example 58 | 4.2E−05 | 1.0E−06 | 19.4 | 0.002 | 579 |
| Example 53 | 4.2E−05 | 2.0E−06 | 19.4 | 0.006 | 632 |
| Example 54 | 4.2E−05 | 3.0E−06 | 19.4 | 0.05 | 666 |
| Example 55 | 4.2E−05 | 6.0E−06 | 19.4 | 0.7 | 624 |
| Example 56 | 4.2E−05 | 8.0E−06 | 19.4 | 0.99 | 600 |
| Comparative Example 59 | 4.2E−05 | 1.0E−05 | 19.4 | 1.12 | 566 |
| Comparative Example 60 | 5.0E−05 | 1.0E−06 | 20.8 | 0.002 | 580 |
| Example 57 | 5.0E−05 | 2.0E−06 | 20.8 | 0.006 | 622 |
| Example 58 | 5.0E−05 | 3.0E−06 | 20.8 | 0.05 | 669 |
| Example 59 | 5.0E−05 | 6.0E−06 | 20.8 | 0.7 | 637 |
| Example 60 | 5.0E−05 | 8.0E−06 | 20.8 | 0.99 | 630 |
| Comparative Example 61 | 5.0E−05 | 1.0E−05 | 20.8 | 1.12 | 571 |
| Comparative Example 62 | 6.0E−05 | 1.0E−06 | 22.2 | 0.002 | 540 |
| Comparative Example 63 | 6.0E−05 | 2.0E−06 | 22.2 | 0.006 | 555 |
| Comparative Example 64 | 6.0E−05 | 3.0E−06 | 22.2 | 0.05 | 576 |
| Comparative Example 65 | 6.0E−05 | 6.0E−06 | 22.2 | 0.7 | 565 |
| Comparative Example 66 | 6.0E−05 | 8.0E−06 | 22.2 | 0.99 | 532 |
| Comparative Example 67 | 6.0E−05 | 1.0E−05 | 22.2 | 1.12 | 499 |

As shown in Tables 1 to 6 and FIGS. 3 to 5, it was confirmed that the respective open voltages of Examples 1 to 60 in which the content of Cu in the n-CIGS layer was within the range of 15 to 21 at. % and the content of Zn in the range of 0.005 to 1.0 at. %, were larger than the respective open voltages of Comparative Examples 1 to 67.

Comparative Example 1 having the n-typed surface of the p-CIGS layer by the thermal diffusion method has a distribution of concentrations of Cd in the depth direction (thickness direction) of the p-CIGS layer and fails to have a steep pn junction interface, whereby the diffusion potential becomes smaller. On the other hand, in Examples 1 to 60, the n-type part and the p-type part are clearly distinguished from each other to form a steep pn junction, whereby the diffusion potential becomes larger. This is a reason why each of the open voltages of Examples 1 to 67 is larger than the open voltage of Comparative Example 1.

LIST OF REFERENCE SYMBOLS

2 solar cell; 4 soda-lime glass; 6 back electrode layer; 8 p-type semiconductor layer (p-CIGS layer); 10 n-type semiconductor layer (n-CIGS layer); 12 semi-insulating layer; 14 window layer (transparent conductive layer); 16 top electrode (extraction electrode); $E_c$ energy level of bottom of conduction band; $E_F$ Fermi level; $E_V$ energy level of top of conduction band; $\Delta E_c$ CBM offset; $E_d$ defect levels.

What is claimed is:

1. A solar cell comprising:
    a p-type semiconductor layer containing a group Ib element, a group IIIb element, and a group VIb element; and
    an n-type semiconductor layer containing a group Ib element, a group IIIb element, a group VIb element, and Zn and formed on the p-type semiconductor layer,
    wherein a content of the group Ib element in the n-type semiconductor layer is from 15 to 21 at. % to a total number of atoms of the group Ib element, the group IIIb element, the group VIb element, and Zn in the n-type semiconductor layer,
    wherein a content of Zn in the n-type semiconductor layer is from 0.005 to 1.0 at. % to the total number of atoms of the group Ib element, the group IIIb element, the group VIb element, and Zn in the n-type semiconductor layer, and
    wherein Zn is uniformly dispersed in the n-type semiconductor layer.

2. The solar cell according to claim 1, wherein a bandgap of the n-type semiconductor layer is larger than a bandgap of the p-type semiconductor layer.

3. The solar cell according to claim 1, wherein the group Ib elements in the p-type semiconductor layer and in the n-type semiconductor layer are Cu,
    wherein the group IIIb elements in the p-type semiconductor layer and in the n-type semiconductor layer are one element or two elements selected from the group consisting of In, Ga, and Al, and
    wherein the group VIb elements in the p-type semiconductor layer and in the n-type semiconductor layer are at least one element selected from Se and S.

4. The solar cell according to claim 3, wherein the group IIIb elements in the p-type semiconductor layer and in the n-type semiconductor layer are In and Ga, and
    wherein a ratio of the number $N_{Ga}$ of Ga atoms to a total of the number $N_{In}$ of In atoms in the n-type semiconductor layer and the number $N_{Ga}$ of Ga atoms in the n-type semiconductor layer, $N_{Ga}/(N_{In}+N_{Ga})$, is larger than a ratio of the number $P_{Ga}$ of Ga atoms to a total of the number $P_{In}$ of In atoms in the p-type semiconductor layer and the number $P_{Ga}$ of Ga atoms in the p-type semiconductor layer, $P_{Ga}/(P_{In}+P_{Ga})$.

5. The solar cell according to claim 3, wherein the group IIIb elements in the p-type semiconductor layer and in the n-type semiconductor layer are Ga and Al, and
    wherein a ratio of the number $N_{Al}$ of Al atoms to a total of the number $N_{Ga}$ of Ga atoms in the n-type semiconductor layer and the number $N_{Al}$ of Al atoms in the n-type semiconductor layer, $N_{Al}/(N_{Ga}+N_{Al})$, is larger than a ratio of the number $P_{Al}$ of Al atoms to a total of the number $P_{Ga}$ of Ga atoms in the p-type semiconductor layer and the number $P_{Al}$ of Al atoms in the p-type semiconductor layer, $P_{Al}/(P_{Ga}+P_{Al})$.

6. The solar cell according to claim 3, wherein the group IIIb elements in the p-type semiconductor layer and in the n-type semiconductor layer are In and Al, and
    wherein a ratio of the number $N_{Al}$ of Al atoms to a total of the number $N_{In}$ of In atoms in the n-type semiconductor layer and the number $N_{Al}$ of Al atoms in the n-type semiconductor layer, $N_{Al}/(N_{In}+N_{Al})$, is larger than a ratio of the number $P_{Al}$ of Al atoms to a total of the number $P_{In}$ of In atoms in the p-type semiconductor layer and the number $P_{Al}$ of Al atoms in the p-type semiconductor layer, $P_{Al}/(P_{In}+P_{Al})$.

7. The solar cell according to claim 1, wherein a thickness of the n-type semiconductor layer is from 50 to 200 nm.

* * * * *